(12) United States Patent
Lee

(10) Patent No.: US 7,257,887 B2
(45) Date of Patent: Aug. 21, 2007

(54) DIE HOLDING APPARATUS FOR BONDING SYSTEMS

(76) Inventor: David Lee, 2497 Technology Dr., Hayward, CA (US) 94545

( * ) Notice: Subject to any disclaimer, the term of this patent is extended or adjusted under 35 U.S.C. 154(b) by 396 days.

(21) Appl. No.: 10/867,187

(22) Filed: Jun. 14, 2004

(65) Prior Publication Data

US 2005/0274003 A1   Dec. 15, 2005

(51) Int. Cl.
   B23P 19/00   (2006.01)
(52) U.S. Cl. .............. 29/743; 29/760; 29/740; 29/720; 29/833; 228/180.22; 228/180.21; 438/15
(58) Field of Classification Search ........... 29/729, 29/739, 743, 428, DIG. 44, 745, 748; 228/180.21, 228/180.22, 180.05, 902, 253; 219/121.64, 219/56.21, 56.22, 615–616; 438/15, 612; 257/746
   See application file for complete search history.

(56) References Cited

U.S. PATENT DOCUMENTS 3,736,651 A * 6/1973 Law et al. ............... 29/428
4,558,812 A    12/1985 Bailey et al.
5,244,143 A    9/1993  Ference et al.
6,348,401 B1   2/2002  Chen et al.
6,389,688 B1 * 5/2002  Srivastava et al. ........... 29/833
6,444,561 B1   9/2002  Wang et al.
6,505,397 B1 * 1/2003  Mimata et al. ............... 29/740
6,527,158 B1   3/2003  Brouillette et al.
6,536,653 B2   3/2003  Wang et al.
6,620,722 B2   9/2003  Kuo et al.
6,680,213 B2   1/2004  Farnworth
7,127,805 B2 * 10/2006 Watson ..................... 29/827
7,131,192 B2 * 11/2006 Stanford .................... 29/827

* cited by examiner

Primary Examiner—Minh Trinh
(74) Attorney, Agent, or Firm—C. Bart Sullivan

(57) ABSTRACT

A die holding apparatus to form electrical contacts on individual dies is described. In one embodiment, a semiconductor device holder is used to hold individual dies for processing and reprocessing. The semiconductor device holder holds each individual die in a separate processing cavity configured to hold each individual die in a predetermined processing position. In one embodiment, a vacuum force is used to hold one or more dies in respective processing cavities with a predetermined level of force even if other adjacent die processing cavities are unoccupied by other individual dies.

7 Claims, 4 Drawing Sheets

DIE HOLDING APPARATUS FOR BONDING SYSTEMS

BACKGROUND OF THE INVENTION

1. Field of the Invention

The present invention relates generally to semiconductor manufacture, and more particularly relates to a system for fabricating contacts on semiconductor components.

2. Description of the Related Art

Generally, microelectronic devices include one or more die (i.e., micro integrated circuits formed on a single substrate) having a multitude of die bond pads, a chip body, and an interconnection scheme to connect the pads on the die to a supporting substrate. Generally, the supporting substrate is formed into a package around the die to provide physical protection from contaminates. The combination of these is typically referred to as a "chip package". Conventional packaging includes packages such as dual-inline package (DIP), single-inline package (SIP), ball grid array (BGA), and others.

Conventionally, dies are formed on wafers in a batch process. A wafer generally contains many dies that are eventually singulated to produce individual dies. One current manufacturing process called "wafer bumping" provides electrical contacts (e.g., solder bumps) to a wafer of dies before the singulation process occurs. Once the electrical contacts are formed, the wafer is diced up (i.e., singulated) to form individual dies. Generally, the next step in the process may include individual dies being attached to supporting substrate or placed onto a tape and reel carrier package for later use. In the case of packaged dies, individual dies are usually stored and removed from their packaging at a later time for attachment to a supporting substrate. Dies are then often attached to a substrate using an attachment process or may be processed using a flip chip process whereby each die is flipped over onto a substrate for connection thereto.

Unfortunately, putting electrical contacts on a wafer of dies is often an expensive process. For example, a wafer may be very large and contain many dies. A specialized wafer holding table is often used to hold the wafer to allow a specialized wire bonding apparatuses to apply electrical contacts to the dies in a predetermined patterns, e.g., a bumping pattern. The specialized wafer holding table is often very expensive and cumbersome to use. In addition, such a specialized wire bonding apparatus usually is required to work with the specialized wafer holding table. The specialized wire bonding apparatus is generally programmed to form electrical contacts on the dies for the entire wafer. While such a batch process may be adequate for wafers having dies that have a common bumping pattern, even the slightest change in the bumping patterns, wafer to wafer, may lead to increased manufacturing costs associated with the programming time required for each wafer. In addition, if an error is introduced into the wafer bumping process causing the bumping pattern to be incorrect, some or all of the dies may be deemed defective as the cost of repairing, e.g., reworking, singulated dies may be prohibitive. Further, wafer bumping errors such as these if not caught may affect more than one batch of wafers exacerbating the problem, slowing process throughput, and increasing the cost of die processing.

Therefore, what is needed is an apparatus and method to provide electrical contacts on individual electronic circuits in high volume that is efficient, flexible, and economical.

SUMMARY OF THE INVENTION

An embodiment of the present invention provides an apparatus configured to support individual dies to form one or more electrical contacts thereon. The apparatus includes a vacuum plate having at least one vacuum orifice extending therethrough and a movable die holding carrier in vacuum communication with the vacuum plate. The movable die holding carrier includes a die supporting plate configured with a plurality of vacuum apertures. Each of the plurality of vacuum apertures sized to allow a predetermined vacuum pressure to be applied by the at least one vacuum orifice to at least a portion of one of the individual dies adjacent thereto while preventing the one of the individual dies adjacent thereto from being drawn through the vacuum orifice. The apparatus includes a die alignment plate disposed on one side of the die supporting plate. The die alignment plate includes a plurality of die receiving openings configured to receive the one of the individual dies therein, each of the die receiving openings extending though the die alignment plate to expose an upper surface of the die supporting plate. The upper surface of the die supporting plate having one or more of the at least one vacuum apertures positioned in communication with a respective die receiving opening, at least a portion of the upper surface and the respective die receiving opening adjacent thereto defining a die processing cavity.

An embodiment of the present invention provides a die holding apparatus configured to hold a plurality of individual dies with a vacuum pressure in position to form a plurality of electrical contacts thereon using a wire bonding system. The apparatus includes a frame defined by a bottom and a sidewall extending from the bottom, the bottom and the sidewall defining a cavity, and a vacuum plate disposed within the cavity. The vacuum plate having a plurality of vacuum orifices extending therethough to a top surface of the vacuum plate. The apparatus includes a movable die holding carrier disposed in slidable contact with the top surface. The movable die holding carrier comprising a die supporting plate and a die alignment plate, the die alignment plate being disposed on an upper surface of the die supporting plate, the die supporting plate including a plurality of vacuum apertures therethrough. At least some of the plurality of vacuum apertures being in vacuum communication with the plurality of vacuum orifices. The die alignment plate including a plurality of die alignment openings, each of the plurality of die alignment openings having at least one of the plurality of vacuum apertures in vacuum communication therewith, each of the plurality of die alignment openings and a portion of the upper surface adjacent thereto defining a plurality of die processing cavities. Each of the plurality of die processing cavities being configured to receive and position one of the plurality of individual dies therein in a predetermined processing position. One or more of the plurality of vacuum apertures of the die supporting plate being sized to provide a predetermined suction force on at least a portion of a respective one of the pluralities of individual dies adjacent thereto when a vacuum pressure is coupled to the vacuum plate such that the respective one of the pluralities of dies is held against the upper surface of the die supporting plate defining a bottom of a respective die positioning cavity.

An embodiment of the present invention provides a method for holding one or more individual dies with a vacuum pressure in a processing position for forming one or more electrical contacts thereon with a wire bonding system.

The method including positioning a die supporting plate having a plurality of vacuum openings on an upper surface of a vacuum plate. The vacuum plate having a plurality of vacuum orifices in vacuum communication with the vacuum openings. The method includes positioning a die alignment plate having a plurality of die receiving openings on a top surface of the die supporting plate. The die receiving openings and the top surface of the die supporting plate forming a plurality of die processing cavities, each of the die processing cavities configured to receive and align one or more individual dies in a processing position. The method further includes receiving the one or more individual dies within a respective die processing cavity, aligning the one or more individual dies, and providing an independent vacuum force to the one or more individual dies using at least one of the vacuum openings adjacent thereto. The independent vacuum force being of a predetermined suction force value configured to hold the one or more individual dies for processing. The method includes forming the electrical contacts on an upper surface of the one or more individual dies with the wire bonding system.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE PREFERRED EMBODIMENT

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
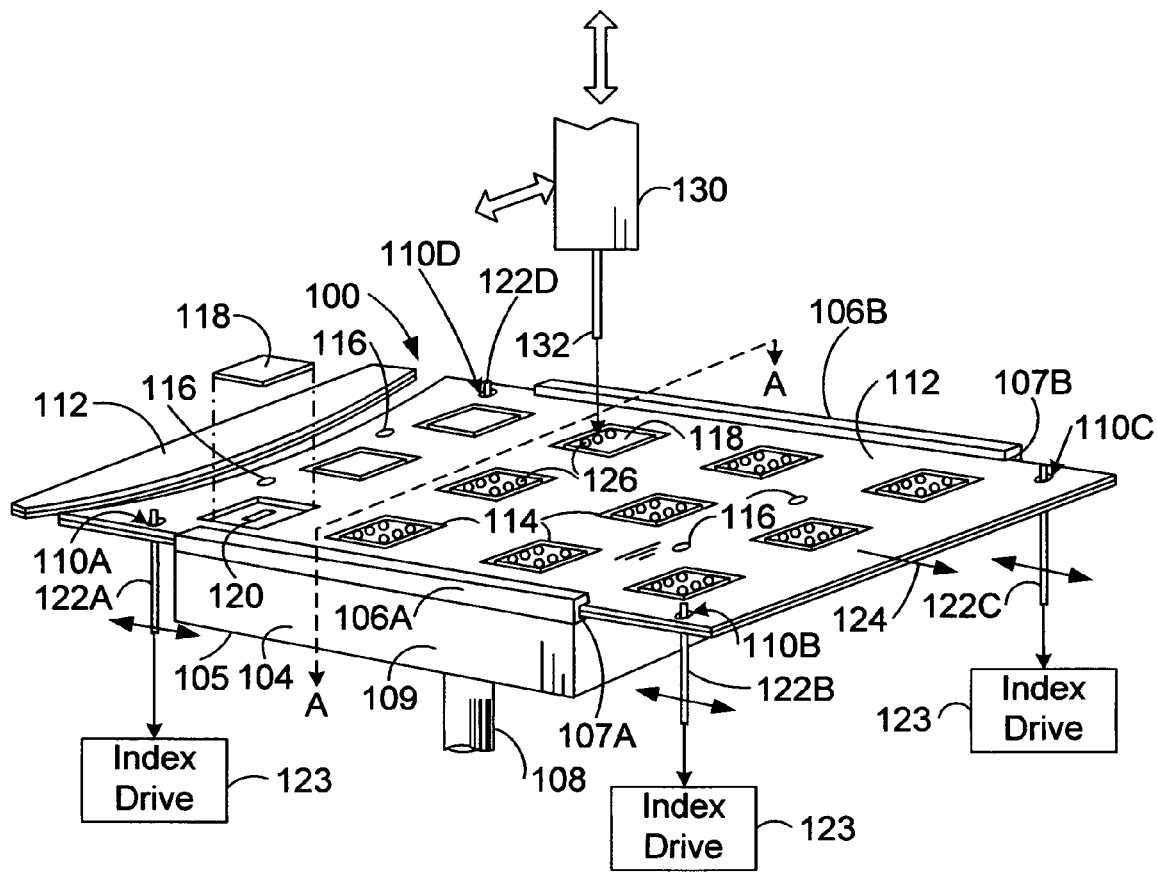
FIG. 1 is a perspective view of one embodiment of a semiconductor device holder in accordance with embodiments of the invention.

FIG. 1 is a perspective view of one embodiment of a semiconductor device holder 100 in accordance with embodiments of the invention. Semiconductor device holder 100 includes a frame 104. Frame 104 includes a sidewall 109 and a bottom 105. Frame 104 may be formed from any number of rigid, semi-ridged, and flexible materials such as metals, plastics, ceramics, woods, and the like that may be used to advantage. Frame 104 may be formed using virtually any process such as die-casting, forging, machining, and the like. Frame 104 may be coupled to a vacuum line 108, e.g., a vacuum connection, configured to connect frame 104 to at least one external vacuum force source, embodiments of which are described further below. In one embodiment, frame 104 includes a slot member 106A and a slot member 106B configured to allow a movable die holding carrier 112 to be slidably positioned relative frame 104. Slot member 106A and slot member 106B are disposed on an upper portion of sidewall 109. Slot member 106A and slot member 106B are configured to allow movable die holding carrier 112 to be moved in a processing position relative frame 104 along a processing path 124. In one configuration, slot member 106A and slot member 106B each have a respective longitudinal slot 107A and 107B. Each longitudinal slot 107A and 107B is configured to slidably support edges of movable die holding carrier 112. In one processing embodiment, slot member 106A and slot member 106B and respective longitudinal slots 107A and 107B are positioned such that movable die holding carrier 112 may be moved horizontally over frame 104 during an electrical connection bumping process of one or more individual semiconductor devices, i.e. one or more dies 118.

Movable die holding carrier 112 is configured to hold one or more dies 118 in a processing position within a respective die-processing cavity 114 formed therein. In one embodiment, movable die holding carrier 112 may be sized in length to extend along processing path 124 such that a plurality of die-processing cavities 114 may position one or more dies 118 along a predetermined processing path length, e.g., a shorter processing path for fewer dies 118 or a longer processing path to process more dies 118. For example, movable die holding carrier 112 may be configured with a predetermined length configured to allow the processing of a predetermined number of one or more dies 118 such that as movable die holding carrier 112 is finishing its process, another movable die holding carrier 112 may be positioned along processing path 124. Movable die holding carrier 112 may be configured in virtually any dimension that may be used to advantage. For example, movable die holding carrier 112 may be configured such that after formation of one or more electrical connections 126 on one or more dies 118, such movable die holding carrier 112 may be sized to be packaged for storage and shipment with one or more dies 118 stored within their respective die-processing cavities 114 for later retrieval therefrom. Thus, movable die-holding carrier 112 may be configured as a die carrier that may be configured to support one or more dies 118, e.g., a plurality of individual integrated circuits, for processing electrical contacts thereon within their respective die-processing cavities 114 and may be configured as a storage device to store such processed one or more dies 118.

Each die processing cavity 114 is in vacuum communication with vacuum line 108 via one or more orifices 120 described further herein. In one operational embodiment, when a vacuum is applied to vacuum line 108, one or more dies 118 are held within a respective die processing cavity 114 by a predetermined suction force applied thereto from vacuum apertures 120 as described further below. Movable die holding carrier 112 includes one or more position markers 116 configured to provide one or more registration processing positions to an apparatus 130 used to form electronic connections 126, e.g., solder bumps, gold bumps, and the like, on one or more dies 118 during processing. Apparatus 130 may be selected from a variety of devices such as wire bonding machines configured to form electrical connections 126 on one or more dies 118 using devices such as a capillary 132 to form such electrical connections 126.

In one embodiment, movable die holding carrier 112 is positioned, i.e., moved along processing path 124, during die processing in an indexed motion. Indexed motion is defined herein as a step-wise motion imparted to movable die holding carrier 112. Such indexed motion positions one or more dies 118 along processing path 124 relative apparatus 130 in a step-wise manner, e.g., each step, or fraction thereof, and moves one or more dies 118 into a processing position relative apparatus 130. For example, in one configuration movable die holding carrier 112 includes a plurality of indexing holes 110A-D. Indexing holes 110A-D may be configured to receive a respective index drive member 122A-D therein. Each index drive member 122A-D is attached to an index drive system 123 configured to move removable die holding carrier 112 along processing path 124. Index drive system 123 may be selected from virtually any type of motion imparting system configured to move movable die holding carrier 112 along processing path 124. For example, during die processing, index drive system 123 and index drive members 122A-D may move movable die holding carrier 112 along processing path 124 relative apparatus 130 and frame 104. While for clarity movable die holding carrier 112 is described being moved along processing path 122 with index drive system 123, other systems configured to move movable die holding carrier 112 are contemplated such as robotic systems, conveyor systems, and the like that may position movable die holding carrier 112 and one or more dies 118 for processing using linear and non-linear motion.

Figure 2:
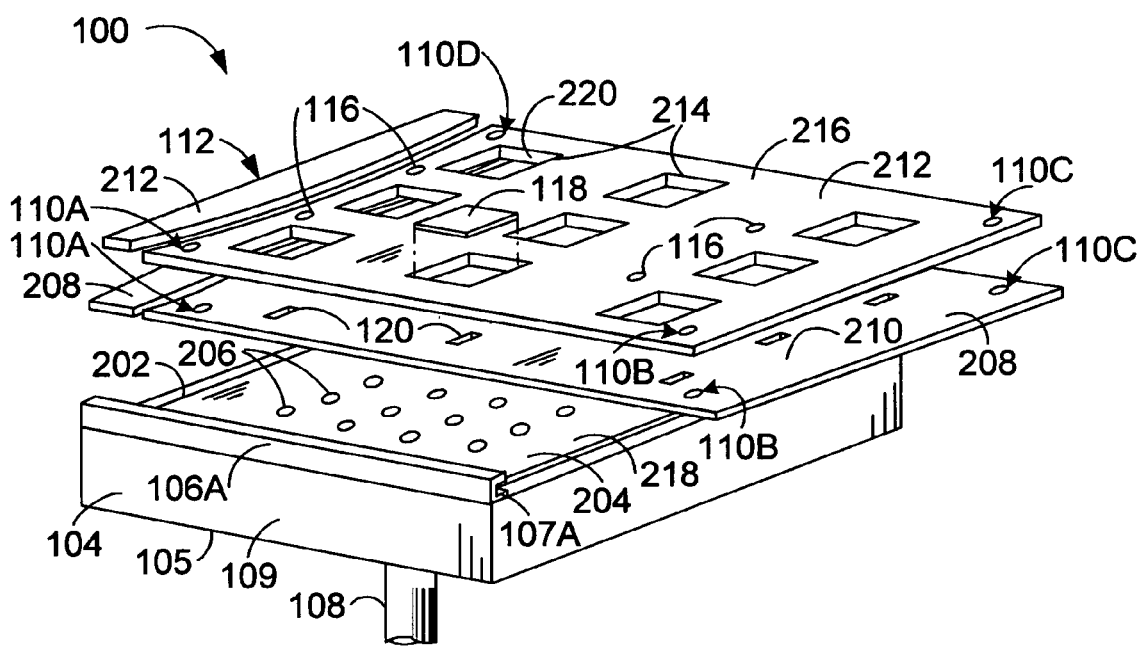
FIG. 2 is an exploded perspective view of one embodiment of a semiconductor device holder in accordance with embodiments of the invention.

FIG. 2 is an exploded perspective view of one embodiment of a semiconductor device holder 100 in accordance with embodiments of the invention. In one embodiment a movable die holding carrier 112 includes a die supporting plate 208. Die supporting plate 208 may be formed from a variety of rigid, semi-rigid, and flexible materials that may be used to advantage. For example, die supporting plate 208 may be formed from materials such as metal, plastic, ceramics, and the like, configured with a predetermined thickness to support one or more dies 118 on an upper surface 210 thereof for processing. In one configuration, die supporting plate 208 may be configured as a heat sink to protect one or more dies 118 from excessive heat during processing. For example, die supporting plate 208 may be formed of metal configured to remove heat from one or more dies 118 disposed upon upper surface 210 as described herein. In another configuration, die supporting plate 208 may be configured to draw electrical charges away from one or more dies 118 to protect one or more dies 118 disposed thereon from electrical static discharge (ESD).

Die supporting plate 208 includes one or more vacuum apertures 120 extending therethrough to upper surface 210. Vacuum apertures 120 may be sized to allow a predetermined suction force to be applied to at least one surface, such as a top portion, of one or more dies 118 within a predetermined range of suction force during processing. For example, such suction force may be configured to hold an individual one of one or more dies 118 against upper surface 210 while preventing such an individual die 118 from being pulled through vacuum aperture 120 disposed adjacent thereto. Vacuum apertures 120 may be configured with virtually any shape to accommodate structural portions of one or more dies 118 disposed therein to allow a die surface to be held in a stable position for processing, i.e. forming electrical contacts on such bottom surface of an individual die 118. To further provide alignment, vacuum apertures 120 may be sized and configured to allow such portions of one or more dies 118 therethrough, and be configured to assist in the stabilization and alignment of one or more dies 118 supported thereby for processing. For example, consider the case where an individual die 118 includes a structural component, such as an optical component, extending therefrom. Vacuum apertures 120 may be sized and configured to allow such an optical component structure to extend downward though and into such vacuum aperture 120. Vacuum apertures 120 may also be configured such that the physical structure of such a component may be used in cooperation with sidewalls of vacuum apertures 120 to help stabilize such an optical component during die processing. Thus, vacuum apertures 120 may be sized to accommodate one or more structures or components, e.g., optical components, and shaped to use such structures and components in cooperation with an alignment structure configured to urge and further hold and stabilize such an individual die 118 into a predetermined processing position. In addition, such vacuum aperture 120 and thickness of die supporting plate 208 may help prevent such component part from being damaged. For example, a vacuum aperture 120 may be configured to suspend (e.g., support) a component, e.g., an optical component, from touching at least one or more surfaces of semiconductor device holder 100 that if put in contact with such component, such surfaces may impart damage thereto.

Movable die holding carrier 112 includes at least one die alignment plate 212. Die alignment plate 212 includes one or more die receiving openings 214 extending though die alignment plate 212 to expose at least a portion of upper surface 210 of die support supporting plate 208. Each die receiving opening 214 is sized to receive a least one individual die 118 of one or more dies 118 therein, for example, as illustrated in FIG. 1. To facilitate manufacture, die receiving openings 214 may be formed in die alignment plate 212 using a plurality of manufacturing techniques such as laser cutting, stamping, sawing, and the like. Die receiving openings 214 are defined by one or more sidewalls 220. In one configuration, at least a portion of sidewalls 220 of die receiving openings 214 provides processing alignment for one or more dies 118 as described further below. In one configuration, die alignment plate 212 may be sized with a thickness that is greater than the thickness, e.g., height, of one or more dies 118. For example, for one or more dies 118 having a thickness of less than one mil die alignment plate 212 may be sized with a thickness of about one mill. For one or more dies 118 having a thickness of less than about thirty mils, die alignment plate 212 may be sized with a thickness of about thirty mils.

In one embodiment, die supporting plate 208 and die alignment plate 212 are attached together to form movable die holding carrier 112. Die supporting plate 208 and die alignment plate 212 may be coupled using virtually any attachment technique such as bonding, welding, stamping, fastening, and the like, embodiments of which are described further below. When die alignment plate 212 and die supporting plate 208 are coupled together to form movable die holding carrier 112, die receiving opening 214 and upper surface 210 adjacent thereto define a respective die processing cavity 114, examples of which are illustrated in FIG. 1. For example, a portion of upper surface 210 of die alignment plate 212 disposed adjacent a die receiving opening 214 defines a bottom portion of a die processing cavity 114. To provide vacuum suction to one or more dies 118 during processing, one or more vacuum apertures 120 are positioned to be in vacuum communication with at least a portion of a respective die processing cavity 114 as described further below.

Semiconductor device holder 100 also includes a vacuum plate 204 disposed within a vacuum plate receiving receptacle 202, e.g., recess, disposed within and defined by a sidewall 109 and a bottom 105. Vacuum plate 204 may be configured integral to frame 104. Vacuum plate 204 may also be configured to be removable from a frame 104. Vacuum plate 204 is configured to slidably support movable die holding carrier 112 thereon a top surface 218. Vacuum plate 204 includes a plurality of vacuum orifices 206 disposed therein and extending therethrough to top surface 218. In one embodiment, at least one vacuum orifice 206 is positioned in vacuum communication with at least one vacuum aperture 120. Vacuum plate 204 is in vacuum communication with a vacuum line 108. In one operational embodiment, when a vacuum force, e.g., suction, is applied to vacuum line 108, a suction force is communicated through one or more vacuum orifices 206 to at least one vacuum aperture 120 in vacuum communication therewith to apply a vacuum suction force to a portion of die 118 adjacent thereto as described further herein.

Figure 3:
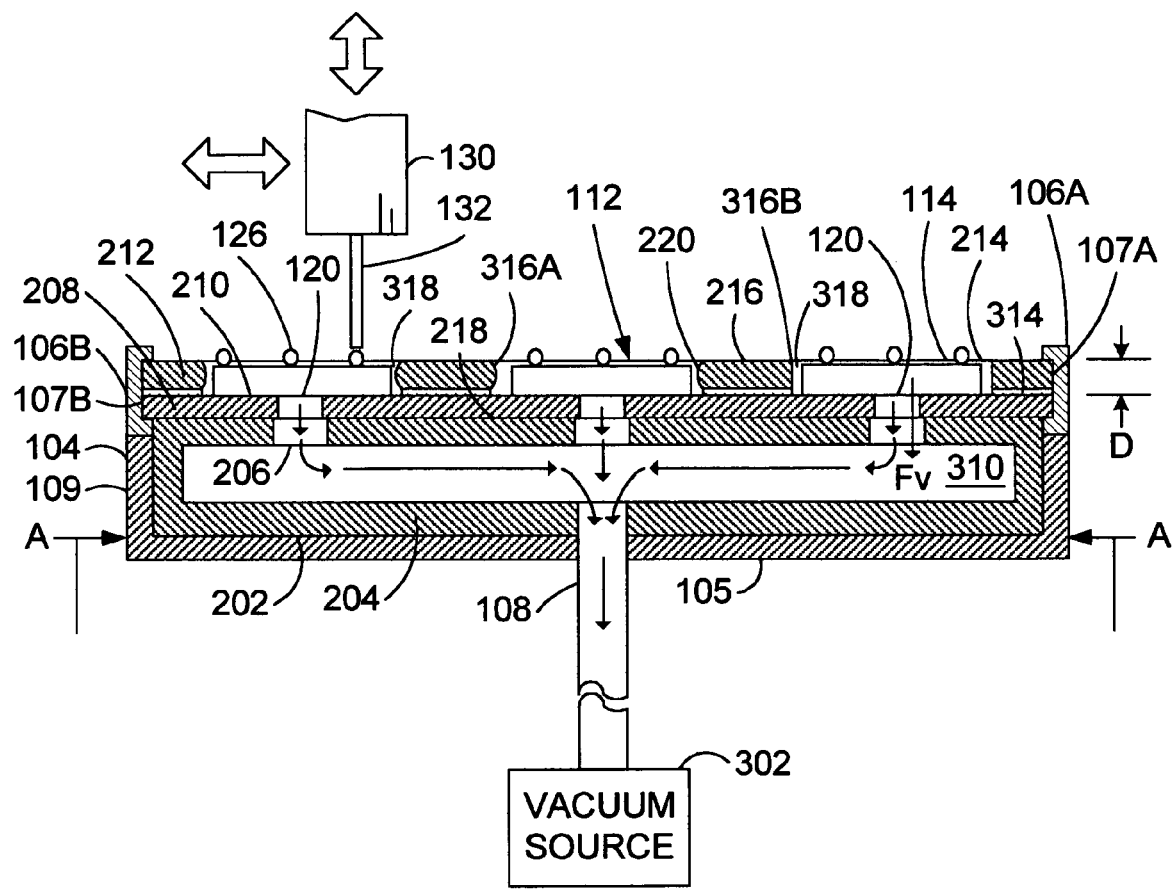
FIG. 3 is a section view along a line A-A of FIG. 1 of one embodiment of a semiconductor device holder in accordance with embodiments of the invention.

FIG. 3 is a section view along a line A-A of FIG. 1 of one embodiment of a semiconductor device holder 100 in accordance with embodiments of the invention. In one embodiment, semiconductor device holder 100 includes a vacuum plate 204 having a cavity 310 disposed therein. Cavity 310 is configured to communicate a substantially uniform vacuum force to a plurality of vacuum orifices 206 and a plurality of vacuum apertures 120 disposed adjacent die receiving cavities 114. In operation, cavity 310 couples a vacuum force, e.g., suction, from a vacuum source 302 to at least some surface portion of one or more dies 118 via a vacuum path defined by a vacuum line 108, cavity 310, one or more vacuum orifices 206, and one or more vacuum apertures 120. Vacuum source 302 may be virtually any type of vacuum supply, such as a vacuum pump, that may have an adjustable or fixed vacuum force.

In one embodiment, cavity 310 may be sized to accommodate changes in vacuum force that may occur during processing. In other words, cavity 310 may be configured as a vacuum reservoir adapted to compensate for at least some fluctuations in vacuum force when applied thereto via vacuum line 108. In one configuration, vacuum orifices 206 and vacuum apertures 120 are configured to provide a predetermined vacuum force to one or more dies 118 that remains within a range of a predetermined vacuum force Fv, i.e., suction force, independent of a presence of other individual dies 118 being held within other die receiving cavities 114. Vacuum apertures 120 and vacuum orifices 206 may be configured to provide an airflow resistance such that if one or more die receiving cavities 114 are empty, a combination of cavity 310, vacuum apertures 120, and vacuum orifices 206 may be configured to provide to one or more dies 118 a vacuum force Fv, e.g., suction, that is within a predetermined vacuum force Fv range independent of other combinations of reservoir 310, vacuum apertures 120, and vacuum orifices 206. In other words, a combination of cavity 310, vacuum apertures 120, and vacuum orifices 206 may be configured to provide to one or more individual dies 118 a vacuum force Fv, e.g., suction, that is within a predetermined vacuum force Fv range independent of other combinations of reservoir 310, vacuum apertures 120, and vacuum orifices 206. Thus, in one operational embodiment, a predetermined vacuum force supplied by vacuum source 302 may allow one or more dies 118 to be held within a range of a predetermined vacuum force Fv even if other die receiving cavities 114 are empty of individual dies 118.

In one embodiment, a die supporting plate 210 and a die alignment plate 212 are bonded together within an adhesive layer 314 to form movable die holding carrier 112. For purposes of clarity, adhesives such as a polymer-based adhesive are described. However, it is contemplated that die supporting plate 210 and die alignment plate 212 may be coupled together using virtually any assembly technique such as gluing, welding, crimping, and the like. It is contemplated that die supporting plate 210 and die alignment plate 212 may be fastened together using other fasteners such as screws, bolts, staples, rivets, and the like. In one embodiment, bonding adhesives may be disposed between opposing surfaces of die supporting plate 210 and die alignment plate 212 to form adhesive layer 314. Adhesive layer 314 may be configured with a predetermined thickness such that an overall depth of die processing cavity 114 is within a predetermined range of a depth D. Such a depth D may be configured to allow one or more dies 118 to be held within die processing cavity 114 at a predetermined depth to accommodate processing and removal therefrom.

In one configuration, a plurality of die supporting plates 210 and die alignment plates 212 may be bonded together to form a plurality of movable die holding carriers 112, each having die receiving cavities 114 adapted to support one or more dies 118 having different sizes and processing requirements. For example, die receiving cavities 114 may be configured individually into one or more various shapes such as polygonal, round, oval, and the like, configured to support a plurality of different die shapes and sizes. In one configuration, die receiving cavities 114 may be configured with a plurality of different shapes and sizes to accommodate different sizes and shapes of dies being processed. In another configuration, a plurality of die supporting plates 210 and die alignment plates 212 may be temporarily assembled together such that an operator, for example, may separate die supporting plates 210 and die alignment plates 212 from one another, and then assemble different die supporting plates 210 and die alignment plates 212 together in different configurations. Such different configurations may form new variants of movable die holding carrier 112 configured to accommodate new combinations of die shapes and sizes. In summary, a plurality of pairs of die supporting plate 210 and die alignment plate 212 may be assembled together to form a plurality of movable die holding carriers 112 that may be configured to support one or more dies 118 of a plurality of shapes, sizes, and processing requirements. Such movable die holding carriers 112 may be assembled to be more permanent or may be temporarily assembled such that variants thereof may be configured as needed.

In another embodiment, die alignment plate 212 includes a plurality of alignment openings 214 having one or more sidewalls 220 that include an alignment edge 316A and an alignment edge 316B which define an opening area thereof of die receiving cavities 114. Alignment edges 316A-B may be of virtually any shape configured to receive one or more dies 118 within die processing cavity 114. For example, alignment edges 316A-B may be straight, ramped, curved, and the like, and configured such that sidewalls 220 hold one or more dies 118 in a predetermined processing position. For example, an alignment edge 316A may include a rounded edge, whereas alignment edge 316B may include a straight edge. Alignment edges 316A-B may also be configured to allow one or more dies 118 when in contact therewith to urge one or more dies 118 into a predetermined alignment forming a gap 318 formed between sidewalls 220 and respective one or more dies 118 positioned therebetween. In one configuration, alignment edges 316A-B may be configured as an alignment edge 316A that are rounded to provide a larger receiving area of alignment openings 214 on a top surface of die alignment plate 212 than at a middle portion of sidewalls 220. Alignment edges 316A-B may be configured to provide gap 318 between such middle portion of adjacent sidewalls and exterior edges of one or more dies 118. Gap 318 may be sized to accommodate variations in die dimensions. For example, gap 318 may be about three to five mils. Gap 318 may also be configured to allow a sufficient airflow around die 118 to allow die 118 to be "sucked" down to vacuum orifices 120 with a predetermined vacuum force Fv. Gap 318 may also be configured to allow a sufficient airflow around one or more dies 118 to help remove heat from one or more dies 118 during processing.

In summary, die alignment plate 212 receives one or more dies 118 into a die processing cavity 114 configured with alignment edges 316A-B. Alignment edges may be adapted to provide an opening area of die receiving cavities 114 at a top surface 216 and configured to assist in the alignment of one or more dies 118 received therebetween. Thus, for example, when one or more dies 118 is received within die processing cavity 114, alignment edge 316A may be rounded to urge one or more dies 118 within die processing cavity 114 in a predetermined processing position. In another operational example, die alignment plate 212 receives one or more dies 118 into a die processing cavity configured with an alignment edge 316B that is about straight forming die receiving opening 214 having an opening area of die receiving cavity 114 at top surface 216 that is about the same dimension as the opening area proximate upper surface 210.

Figure 4:
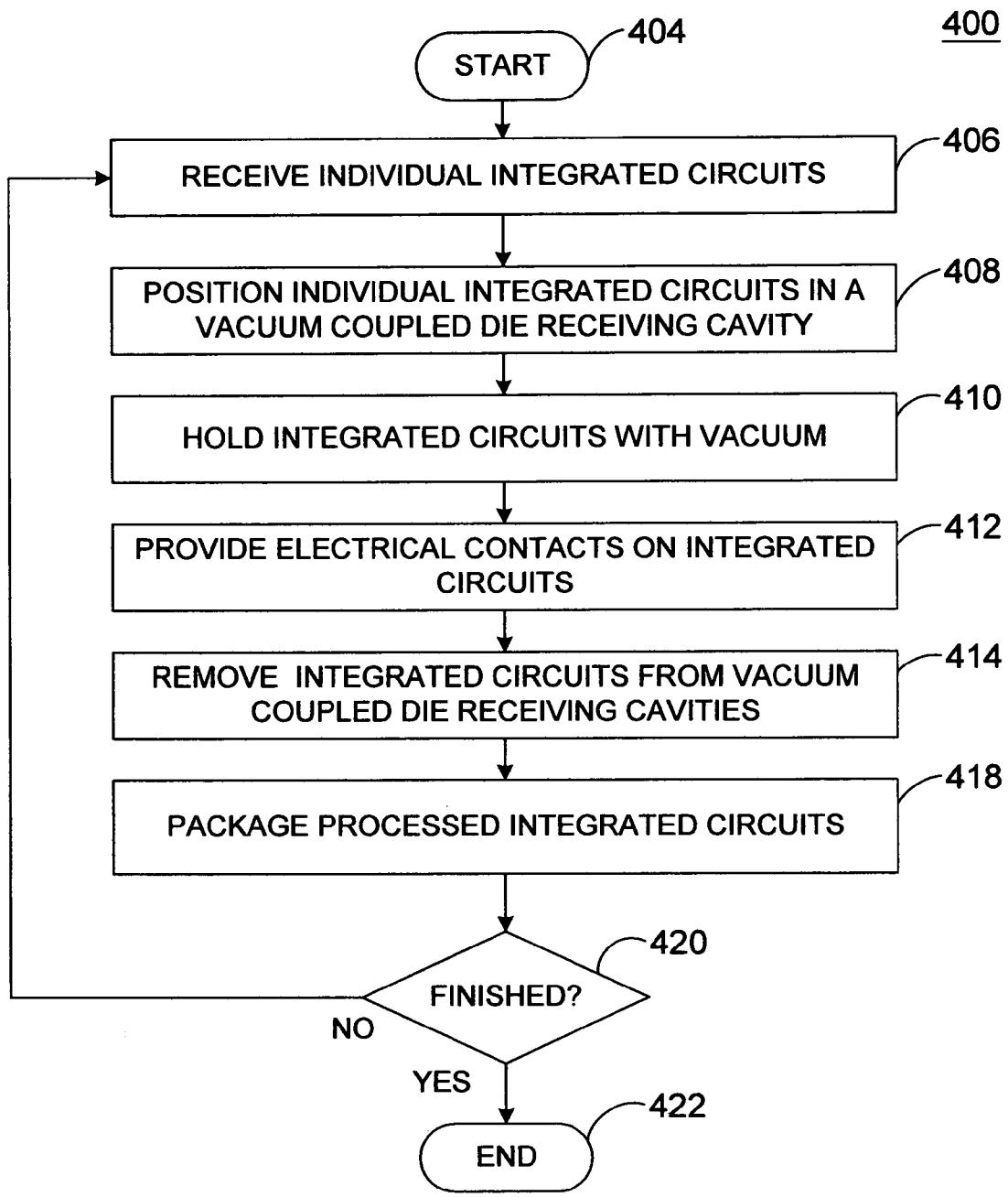
FIG. 4 is a high-level flow diagram of one embodiment of a method of forming electrical contact bumps on semiconductor devices such as dies in accordance with embodiments of the invention.

FIG. 4 is a high-level flow diagram of one embodiment of a method 400 of forming one or more electrical contact bumps 126 on semiconductor devices such as one or more dies 118 in accordance with embodiments of the invention. Method 400 is entered into at 404 for example when a bumping process is initiated by an end user. At 406, one or more dies 118 are received into one or more respective die processing cavities 114. For example, a wafer (not shown) may be singulated (e.g., physically diced up) into one or more dies 118. A pick and place machine (not shown), as known, may be used to place one or more dies 118 into a respective die processing cavity 114.

At 408, each of the one or more dies 118 is aligned within a respective die processing cavity 114. In one embodiment, one or more die alignment openings 214 are configured to urge each of one or more dies 118 received therein into a predetermined processing alignment with a predetermined gap 318 therebetween. To further provide alignment, one or more vacuum apertures 120 may be sized and configured to allow structural portions of one or more dies 118 therethrough. For example, consider the case where an individual one of one or more dies 118 includes an optical component that extends therefrom. Such vacuum aperture 120 may be sized and shaped to accommodate such optical component that protects portions of the optical component. Such vacuum aperture 120 may be configured to use a structure of individual die 118, e.g., optical component, to support such individual die 118 into a predetermined processing position.

At 410, method 400 holds one or more dies 118 within a respective die processing cavity 114 using a vacuum. For example, as illustrated in FIG. 3, a vacuum is coupled from a vacuum source 302 via a vacuum path defined by a vacuum line 108, a cavity 310, one or more vacuum orifices 206, and one or more vacuum apertures 120. A vacuum force Fv on one or more dies 118 is adjusted within a predetermined range of a desired vacuum force by adjusting vacuum source 302. In one embodiment, vacuum force Fv may be adjusted within a predetermined range to enable one or more dies 118 to be held securely for processing without damaging and imparting vibration to one or more dies 118, and without exerting excessive vacuum force Fv on such one or more dies 118 being held.

At 412, one or more dies 118 within respective die processing cavities 114 are moved along with a movable die holding carrier 112 for processing. One or more electrical contacts 126 are disposed on one or more dies 118 being held for processing by movable die holding carrier 112. In one process configuration, electric contacts 126 are disposed thereon to be used for flip-chip processing. In one case, an apparatus 130 may use a capillary 132 to provide electrical contacts 126, e.g., solder balls, gold bumps, and the like, to a surface of one or more dies 118. In an alternate process, one or more dies 118 already having electrical contacts 126 thereon, may be altered by apparatus 130. For example, at 412 apparatus 130 may be used to remove and replace electrical contacts 126 to reconfigure one or more dies 118 for another electrical configuration in a repair process commonly known as "rework".

One or more dies 118 are removed for packaging at 414. In one case, a conventional pick and place machine (not shown) may be used to remove one or more dies 118 from a semiconductor device holder 100. At 418, method 400 packages one or more dies 118 into packages configured for storage. In one operation, movable die holding carrier 112 may be used as a package. For example, one or more dies 118 may be loaded into a movable die holding carrier 112, processed, and then stored in such a movable die holding carrier 112. Such one or more packaged dies 118 may be moved to another location, such as work in process (WIP) inventory storage, for further processing as an example. If method 400 is finished at 420, method 400 proceeds to 422 and ends. If however, method 400 is not finished, method 400 proceeds to 406.

While the foregoing is directed to embodiments of the present invention, other and further embodiments of the invention may be devised without departing from the basic scope thereof, and the scope thereof is determined by the claims that follow.

The invention claimed is:

1. A die holding apparatus configured to hold a plurality of individual dies with a vacuum pressure in position to form a plurality of electrical contacts thereon using a wire bonding system, the apparatus comprising:
    a frame defined by a bottom and a sidewall extending from the bottom the bottom and the sidewall defining a cavity;
    a vacuum plate disposed within the cavity, the vacuum plate having a plurality of vacuum orifices extending therethough to a top surface of the vacuum plate; and
    a movable die holding carrier disposed in slidable contact with the top surface, the movable die holding carrier comprising a die supporting plate and a die alignment plate, the die alignment plate being disposed on an upper surface of the die supporting plate,
    the die supporting plate including a plurality of vacuum apertures therethough, at least some of the plurality of vacuum apertures being in vacuum communication with the plurality of vacuum orifices,
    the die alignment plate including a plurality of die alignment openings, each of the plurality of die alignment openings having at least one of the plurality of vacuum apertures in vacuum communication therewith, each of the plurality of die alignment openings and a portion of the upper surface adjacent thereto defining a plurality of die processing cavities, each of the plurality of die processing cavities being configured to receive and position one of the plurality of individual dies therein in a predetermined processing position, one or more of the plurality of vacuum apertures of the die supporting plate being sized to provide a predetermined suction force on at least a portion of a respective one of the pluralities of individual dies adjacent thereto when a vacuum pressure is coupled to the vacuum plate such that the respective one of the pluralities of dies is held against the upper surface of the die supporting plate defining a bottom of a respective die positioning cavity.

2. The apparatus of claim 1, wherein the vacuum plate includes a vacuum connection configured to connect a vacuum source to the plurality of vacuum orifices.

3. The apparatus of claim 1, wherein the frame comprises a vacuum connection configured to couple a vacuum source to the vacuum plate.

4. The apparatus of claim 1, wherein the die supporting plate and die alignment plate are bonded together to form the movable die holding carrier.

5. The apparatus of claim 4, wherein the die supporting plate and the die alignment plate comprise an adhesive layer disposed therebetween to bond the die supporting plate and the die alignment plate together.

6. The apparatus of claim 1, wherein the die alignment plate is sized in thickness greater than the die height.

7. The apparatus of claim 6, wherein the die alignment plate is sized with a thickness between one mu and thirty mils.

\* \* \* \* \*